United States Patent
Nagayama

(10) Patent No.: US 9,349,755 B2
(45) Date of Patent: May 24, 2016

(54) ARRAY SUBSTRATE AND DISPLAY DEVICE

(71) Applicant: BOE TECHNOLOGY GROUP CO., LTD., Beijing (CN)

(72) Inventor: Kazuyoshi Nagayama, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/443,822

(22) PCT Filed: Sep. 18, 2014

(86) PCT No.: PCT/CN2014/086787
§ 371 (c)(1),
(2) Date: May 19, 2015

(87) PCT Pub. No.: WO2015/180301
PCT Pub. Date: Dec. 3, 2015

(65) Prior Publication Data
US 2016/0118408 A1 Apr. 28, 2016

(30) Foreign Application Priority Data

May 29, 2014 (CN) .......................... 2014 1 0235356

(51) Int. Cl.
*H01L 27/14* (2006.01)
*H01L 27/12* (2006.01)

(52) U.S. Cl.
CPC .......... *H01L 27/124* (2013.01); *H01L 27/1225* (2013.01); *H01L 27/1233* (2013.01)

(58) Field of Classification Search
CPC .............. H01L 27/124; H01L 27/1233; H01L 27/1225
USPC ....................................................... 257/72
See application file for complete search history.

(56) References Cited

U.S. PATENT DOCUMENTS

| 7,719,008 B2 | 5/2010 | Lim et al. |
| 2009/0195724 A1 | 8/2009 | Park et al. |
| 2013/0342781 A1 | 12/2013 | Lee et al. |

FOREIGN PATENT DOCUMENTS

| CN | 101013705 A | 8/2007 |
| CN | 101526676 A | 9/2009 |

(Continued)

OTHER PUBLICATIONS

International Search Report of the International Searching Authority of PCT/CN2014/086787 in Chinese with English translation, mailed Feb. 26, 2015.

(Continued)

*Primary Examiner* — Douglas Menz
(74) *Attorney, Agent, or Firm* — Collard & Roe, P.C.

(57) ABSTRACT

Disclosed is an array substrate including gate lines (210), data lines (220) formed on a base substrate and a plurality of pixel units defined by intersecting the gate lines (210) and the data lines (220). Each pixel unit includes a TFT. In an overlapping area between an active layer (230) and a source (240) of the TFT, the active layer (230) includes at least two first tabs (231) beyond a gate (260) of the TFT which are located on both sides of a central line of the active layer (230) parallel to the gate line (210) respectively and the two first tabs (231) have a same width in a direction of gate line (210). The above-mentioned array substrate can guarantee that the gate-source capacitance is substantially identical to a predesigned capacitance even if the active layer experiences misalignment while being manufactured, thereby decreasing the error of the common electrode voltage $V_{com}$. Further disclosed is a display device including the above-mentioned array substrate.

13 Claims, 3 Drawing Sheets

(56) References Cited

FOREIGN PATENT DOCUMENTS

| CN | 201845776 U | 5/2011 |
|---|---|---|
| CN | 202405263 U | 8/2012 |
| CN | 202677034 U | 1/2013 |
| CN | 104009045 A | 8/2014 |

OTHER PUBLICATIONS

Notice of Transmittal of the International Search Report of PCT/CN2014/086787 in Chinese, mailed Feb. 26, 2015.

Written Opinion of the International Searching Authority of PCT/CN2014/086787 in Chinese with English translation, mailed Feb. 26, 2015.

Chinese Office Action of Chinese Application No. 201410235356.3, mailed Jan. 13, 2015 with English translation.

First Chinese Office Action of Chinese Application No. 201410235356.3, mailed Jan. 13, 2015 with English translation.

Second Chinese Office Action of Chinese Application No. 201410235356.3, mailed Apr. 22, 2015 with English translation.

Third Chinese Office Action of Chinese Application No. 201410235356.3, mailed Jun. 17, 2015 with English translation.

The Notification to Grant the Patent Right (Notice of Allowance) for 201410235356.3 issued on Jul. 23, 2015 with English translation.

The Issued Patent for CN 104009045B (Application No. CN 201410235356.3) which was granted on Sep. 2, 2015 in Chinese with the Chinese granted claims with an English translation.

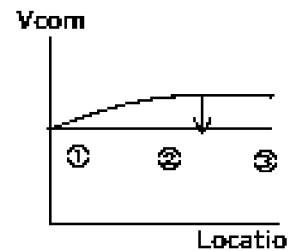
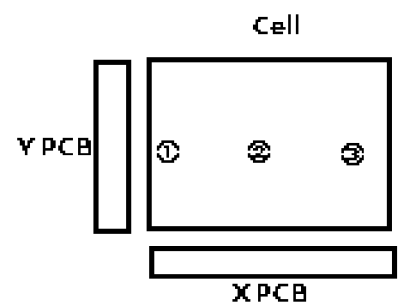
FIG.5a            FIG.5b
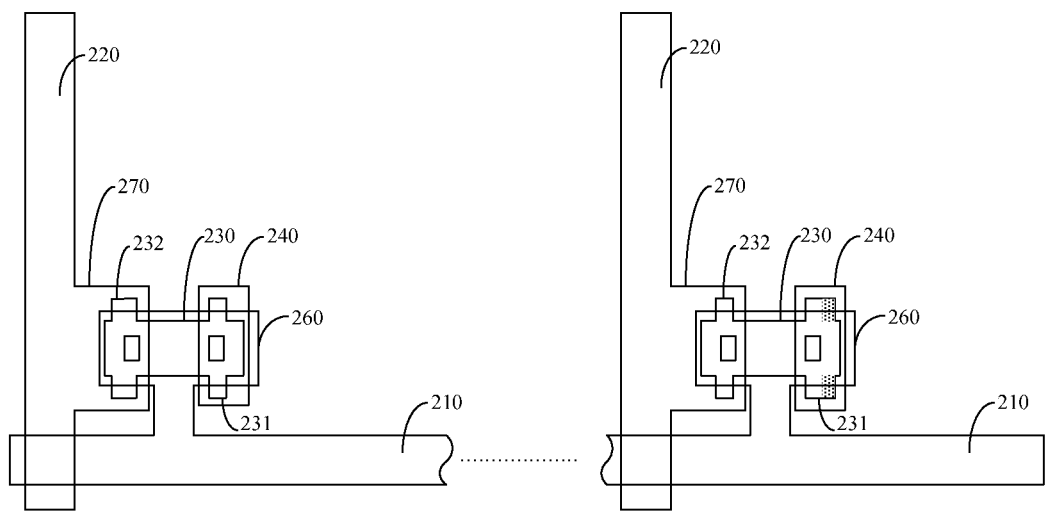
FIG.6a            FIG.6b

ARRAY SUBSTRATE AND DISPLAY DEVICE

CROSS REFERENCE TO RELATED APPLICATIONS

This application is the National Stage of PCT/CN2014/086787 filed on Sep. 18, 2014, which claims priority under 35 U.S.C. §119 of Chinese Application No. 201410235356.3 filed on May 29, 2014, the disclosure of which is incorporated by reference.

TECHNICAL FIELD

Embodiments of the present invention relate to an array substrate and a display device.

BACKGROUND

Common electrode voltages of pixel units on an array substrate should be equal to each other. However in practice, the common electrode voltage $V_{com}=V-\Delta V_p$, wherein $\Delta V_p$ is a jumping voltage of pixel voltage $V_p$ caused by switching on/off the pixel through the gate, V is the actual input common voltage. As shown in FIG. 1, it is an equivalent circuit diagram of one of pixels on the array substrate, $\Delta V_p$ is mainly influenced by the gate-source capacitance $C_{gs}$:

$$\Delta Vp = \frac{C_{gs}}{C_{all}}(V_{gh} - V_{gl}) \quad (1)$$

Wherein $C_{all}$ is a sum of capacitances in the circuit of FIG. 1 (namely equivalent capacitance), and $V_{gh}$ and $V_{gl}$ are high and low electrical level voltages of the gate respectively.

FIG. 2 is a top view of a known array substrate with oxide as an active layer. As shown in FIG. 2, the array substrate comprises a gate line 110, a data line 120, and a TFT (comprising a gate 160, an active layer 130, a source 140 and a drain 170). Typically, the active layer 130 is located over the gate 160 with a gate insulating layer (not shown) interposed therebetween. The drain 170 and source 140 are located over the active layer 130, and there is an etch stop layer (not shown) between the drain 170/source 140 and the active layer 130. The drain 170 and source 140 are connected with the active layer 130 through vias 150 on the etch stop layer, respectively. The projection of active layer 130 is located at the middle of the projection of gate 160. Upper and lower edges of the active layer 130 are apart from respective upper and lower edges of the gate 160 by a small distance. In the manufacturing process, it is possible that process deviation would result in the misalignment of the active layer 130, that is, the projection of active layer 130 is not at the middle of the projection of gate 160 or even beyond edges of the gate 160. As known from the capacitance formula $C=\in S/d$ (where S is the opposite area of parallel plates, $\in$ is the dielectric coefficient of dielectric, d is the distance between the parallel plates), misalignment of active layer 130 might cause the average dielectric coefficient $\in$ between the gate 160 and source 140 (there are at least a gate insulating layer and an active layer comprised between the gate 160 and source 140) to change, which might result in a large error between $C_{gs}$ of each pixel unit and the predesigned $C_{gs}$. Accordingly, $\Delta V_p$ would have large error, and a large error between the actual common voltage $V_{com}$ applied on the common electrode and the predesigned common voltage would be caused, which may affect the displayed images.

SUMMARY

In a first aspect, there is provided an array substrate comprising gate lines, data lines, and a plurality of pixel units defined by intersecting the gate lines and the data lines, wherein each pixel unit comprises a thin film transistor (TFT), in an overlapping area between an active layer and a source of the TFT, the active layer comprises at least two first tabs protruding beyond a gate of the TFT, the at least two first tabs are disposed on both sides of a central line of the active layer parallel to the gate line respectively and have a same width in a direction of gate line.

As an example, the at least two first tabs are arranged in mirror symmetry.

As an example, in an overlapping area between an active layer and a drain of the TFT, the active layer further comprises at least two second tabs protruding beyond a gate of the TFT, the at least two second tabs are disposed on both sides of the central line of the active layer parallel to the gate line respectively and have a same width in the direction of gate line.

As an example, the at least two second tabs are arranged in mirror symmetry.

As an example, a gate driver is disposed outside the array substrate, the larger a distance between the TFT and the gate driver is, the larger the width of the first tab of the active layer of the TFT in the direction of gate line is.

As an example, the pixel units are divided into n groups in terms of columns, wherein $1 \le n \le N$, N is a total number of columns; beginning with a first group of pixel units closest to the gate driver of array substrate, the first tab of active layer of TFT in the $i+1^{th}$ group of pixel units has a width in the direction of gate line greater than that of the first tab of active layer of TFT in the $i^{th}$ group of pixel units by $\Delta W1i$, wherein $1 \le i \le n-1$; the first tabs of active layer of TFT in a same group have same width in the direction of gate line.

As an example, each group of pixel units has same number of columns.

As an example, the larger a distance between the TFT and the gate driver is, the smaller the width of the second tab of the active layer of the TFT in the direction of gate line is.

As an example, the pixel units are divided into m groups in terms of columns, wherein $1 < m \le N$, N is a total number of columns; beginning with a first group of pixel units closest to the gate driver of the array substrate, the second tab of active layer of TFT in the $j+1^{th}$ group of pixel units has a width in the direction of gate line smaller than that of the second tab of active layer of TFT in the $j^{th}$ group of pixel units in the direction of gate line by $\Delta W2j$, where $1 \le j \le m-1$; the second tabs of active layer of TFT in a same group of pixel units have same width in the direction of gate line.

As an example, each group of pixel units has same number of columns.

As an example, wherein m=n.

As an example, wherein in condition that i=j, $\Delta W1_i = \Delta W2_j$.

As an example, a material for the active layer is oxide semiconductor.

In a second aspect, there is provided a display device, comprising any of the above mentioned array substrates.

BRIEF DESCRIPTION OF THE DRAWINGS

In order to clearly illustrate the technical solution of the embodiments of the invention, the drawings of the embodiments will be briefly described in the following; it is obvious

FIGS. 5a and 5b are respectively a graph and a schematic diagram of $V_{com}$ at different locations on a display panel;

FIGS. 6a and 6b are respectively schematic diagrams of two pixel units in an array substrate according to an embodiment of the present invention (which shows the simplified configuration of two pixels at different locations in a same row).

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

In the context, "direction of gate line" refers to the extension direction of gate line. Similarly, "direction of data line" refers to the extension direction of data line. "Overlapping region between active layer and source" refers to a region in a horizontal plane parallel to the substrate (namely the paper plane in the accompanying drawings) where an active layer overlaps a source.

Figure 3:
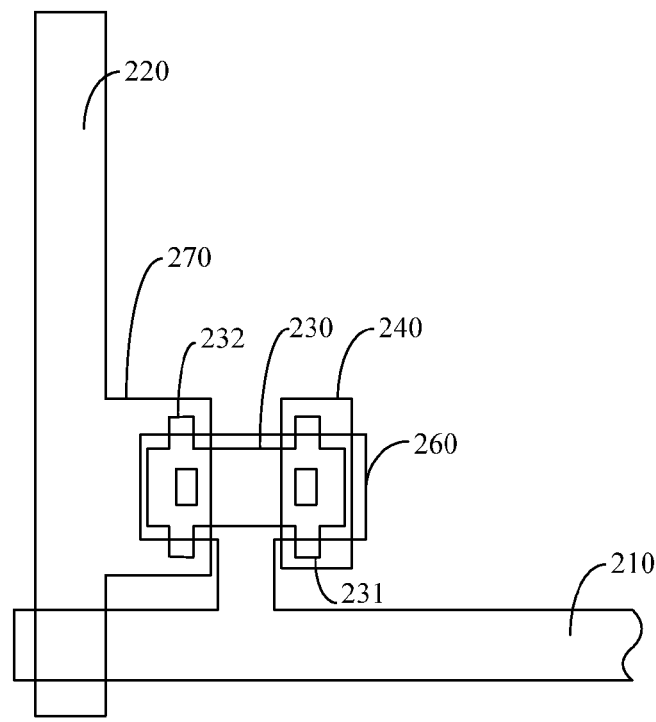
FIG. 3 is a schematic diagram of a pixel unit in an array substrate according to an embodiment of the present invention (which shows the simplified configuration of only one pixel)

As shown in FIG. 3, an array substrate according to an embodiment of the present invention comprises gate lines 210 and data lines 220 formed on a base substrate, and a number of pixel units defined by intersecting the gate lines 210 and the date lines 220. Each of the pixel units comprises a thin film transistor (TFT). In order to avoid a large error between the actual $V_{com}$ and the predesigned $V_{com}$ caused by misalignment of active layer 230 of TFT, in the overlapping region between active layer 230 and source 240 of the TFT, the active layer 230 comprises at least two first tabs 231 protruding beyond the gate 260 of TFT and are located on both sides of a central line of the active layer 230 that is parallel to gate line 210 respectively. The widths of two first tabs 231 in the direction of gate line 210 (namely in the direction parallel to gate line 210) are equal to each other. In order to facilitate manufacturing, the two first tabs 231 are arranged in mirror symmetry.

Figures 4A, 4B:
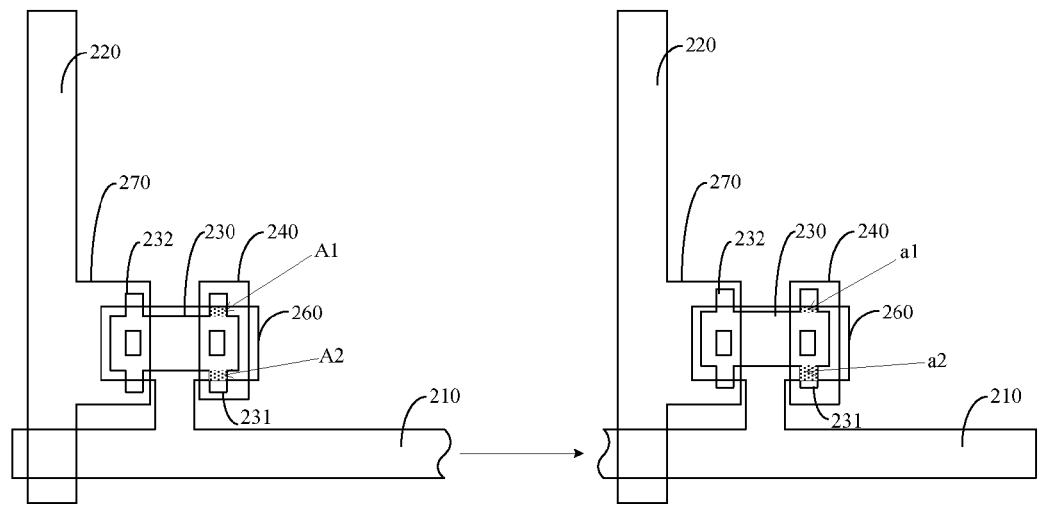
FIGS. 4a and 4b are respectively schematic diagrams of the pixel unit in FIG. 3 before and after the misalignment occurs.

In present embodiment, since the first tabs 231 disposed in overlapping region between active layer 230 and source 240 function as a dielectric layer between gate 260 and source 240, it is possible to reduce the width of active layer 230 in a direction perpendicular to gate line 210 (parallel to extension direction of data line 220) in overlapping region while designing the gate-source capacitance, thereby increasing the misalignment space (namely tolerance range) for the active layer 230 during the manufacturing process thereof. Such a structural design can make gate-source capacitance more precise and can guarantee gate-source capacitance to be equal to the predesigned capacitance as much as possible even if the active layer 230 experiences misalignment in manufacturing. For example, FIG. 4a is a schematic diagram of active layer without misalignment, while in FIG. 4b, the active layer 230 shifts upward. Since two first tabs 231 have equal widths in the direction of gate line 210, in the overlapping region between gate 260 and source 240, the area of active layer does not change, particularly the areas A1+A2=a1+a2. Therefore, the average dielectric coefficient ∈ and S between gate 260 and source 240 do not change. In this way, it allows the capacitance $C_{gs}$ of each pixel unit to be substantially equal to the predesigned capacitance, and the error for $\Delta V_p$ can be reduced. Further, it allows the actual voltage $V_{com}$ applied on the common electrode to be substantially equal to the predesigned voltage, thereby ensuring good display effect. Even if an edge of the active layer 230 at one side reaches the edge of gate 260 due to misalignment, for example, the area a1 becomes 0, the area a2 increases, which can also keep the average dielectric coefficient ∈ between gate 260 and source 240 being constant.

In addition, the active layer 230 has a certain thickness, and an edge part of the source 240 extending beyond the active layer 230 has a certain slope, so it is possible that the source 240 is prone to be broken and the signals from the data line fails to be transmitted to the pixel electrode. After the first tabs 231 are provided in present embodiment, the slope can be decreased gently. Therefore, the edge part of the source 240 beyond the active layer 230 is not easy to be broken, thereby avoid the occurrence of the drain open-circuit to some extent.

In one embodiment, in the overlapping region between the active layer 230 and drain 270 of the TFT, the active layer 230 further comprises at least two second tabs 232 protruding beyond the gate 260 (as shown in FIG. 4a) and the two second tabs 232 are located on both sides of a central line of the active layer 230 parallel to gate line 210. The widths of two second tabs 232 in the direction of gate line 210 are equal to each other. In order to facilitate manufacturing, the two second tabs 232 are arranged in mirror symmetry.

Since the second tabs 232 provided in overlapping regions between active layer 230 and drain 270 function as a dielectric layer between gate 260 and drain 270, it is possible to reduce the width of active layer 230 in a direction perpendicular to gate line 210 (parallel to extension direction of data line 220) in overlapping region while designing the gate-drain capacitance, thereby increasing the misalignment space (namely tolerance range) for the active layer 230 during the manufacturing process thereof. Such a structural design can make gate-source capacitance more precise. That is, the second tabs 232 allow capacitances of pixel units between gate 260 and drain 270 are substantially the same as the predesigned capacitance, thus, the error for the capacitance $C_{all}$ in formulae (1) becomes as smaller as possible. Therefore, the voltage $V_{com}$ is closer to the predesigned value.

Similarly, the second tabs 232 can decrease the slope of the edge of drain 270 beyond the active layer 230. Therefore, the edge part of the drain 270 beyond the active layer 230 is not easy to be broken, thereby avoid the occurrence of the drain open-circuit to some extent.

Since gate delays (also known as RC delays) at different locations are different due to the size of display panel, the common electrode voltages $V_{com}$ of at different locations are different from each other. As shown in FIGS. 5a and 5b, the farther from the gate driver (Y PCB in the figures) is, the larger the gate delay is and the larger the common electrode voltage $V_{com}$ is. The common electrode voltage $V_{com}$ at point □ is greater than that at point □. Therefore, for each pixel, the common electrode voltage $V_{com}$ is not steadily constant, which could cause crosstalk while displaying.

In one embodiment, in order to allow the common electrode voltage $V_{com}$ to be steadily constant, as shown in FIG. 6, the farther from the gate driver side of array substrate is, the larger width of first tabs 231 of active layer 230 of the TFT in the direction of gate line 210 is, that is, the overlapping area between active layer 230 and source 240 has an increasing tendency.

Figure 1:
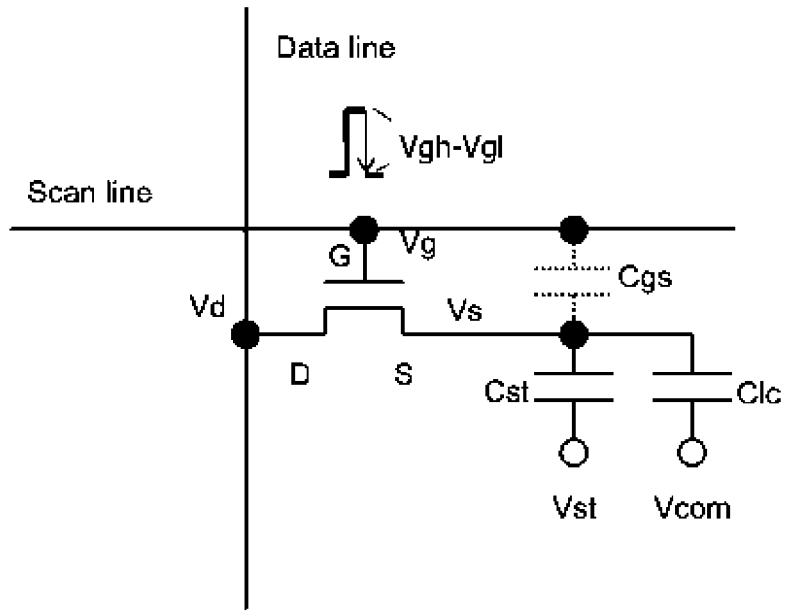
FIG. 1 is an equivalent circuit diagram of one of pixels in an array substrate.
Figure 2:
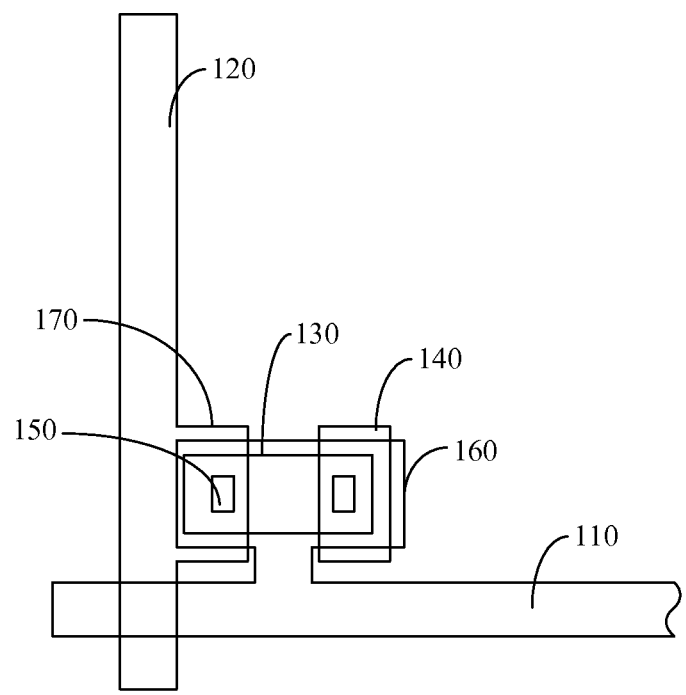
FIG. 2 is a schematic diagram of a known array substrate (which shows the simplified configuration of only one pixel)

$\Delta V_p$ will offset from theoretical value considerably due to the feed-in characteristic (feed-in is the process for generating $\Delta Vp$, which is caused by gate jumping voltage). The main effect factor resulting in the offset is the gate-source capacitance $C_{gs}$. The influence of the capacitance $C_{gs}$ on $\Delta V_p$ is shown in FIG. 1 and formula (1), therefore controlling voltage $C_{gs}$ is important for keeping $\Delta V_p$ steady. While as well known, $C_{gs}$ is generated because the gate layer overlaps the source layer. According to the formula C=∈S/d, wherein s is the opposite area between parallel plates, ∈ is the dielectric coefficient of the dielectric, and d is the distance between the parallel plates, in present embodiment, the capacitance $C_{gs}$ is controlled by ∈.

$$\Delta Vp = \frac{C_{gs}}{C_{all}}(V_{gh} - V_{gl}) \quad (1)$$

For example, the width of first tabs 231 in FIG. 6b is increased in order to increase the overlapping area between active layer 230 and source 240. The active layer 230 is typically made of semiconductor material such as oxide semiconductor (gate 260 and source 240 are typically separated by a gate insulating layer (not shown) and an active layer 230, in which the oxide active layer has a dielectric coefficient greater than that of gate insulating layer), therefore the average dielectric coefficient ∈ of dielectric materials between gate 260 and source 240 will be increased and the capacitance $C_{gs}$ will be increased. Accordingly, $\Delta V_p$ will be increased either. That is, the farther from the gate driver side of the array substrate is, the larger the $\Delta V_p$ of pixel is. According to the formula $V_{com} = V - \Delta V_p$, the farther from the gate driver side of array substrate is, the smaller the common electrode voltage $V_{com}$ is. Therefore, the common electrode voltage far from gate driver side of array substrate in FIG. 5a is relative small. That is, it is possible to make $V_{com}$ curve in FIG. 5a approach horizontal by improving $\Delta V_p$, and in turn make $V_{com}$ being steady constant.

In order to facilitate the manufacturing and the arrangement of array substrate, the pixel units are divided into n groups in terms of columns, wherein 1<n≤N, N is the total number of columns. Beginning with the 1$^{st}$ group of pixel unit that is closest to the gate driver side of array substrate, the first tab 231 of active layer 230 of TFT in the i+1$^{th}$ group of pixel units has a width in the direction of gate line greater than that of the first tab 231 of active layer 230 of TFT in the i$^{th}$ group of pixel units by ΔWE, wherein 1≤i≤n−1. The first tabs 231 of active layer 230 of TFT in the same group have the same width in the direction of gate line. In one example, each group of pixel units has the same number of columns.

In one embodiment, as shown in FIG. 6b, while the width of the first tabs 231 in the direction of gate line 210 on right side of the active layer 230 (on which side the active layer overlaps source 240) becomes larger, the width of the second tabs 232 in the direction of gate line 210 on left side of the active layer 230 (on which side the active layer overlaps the drain 270) becomes smaller. The capacitance between gate 260 and drain 270 is changed by reducing the overlapping area between active layer 230 and drain 270. Since the area of the active layer 230 between gate 260 and drain 270 is decreased, and the average dielectric coefficient ∈ of dielectric material between them is reduced, the capacitance between gate 260 and drain 270 is reduced. Accordingly, in the above-mentioned formulae (1), the capacitance $C_{all}$ is reduced, and the $\Delta V_p$ is increased.

Similarly, in order to facilitate manufacturing and the arrangement of array substrate, pixel units are divided into m groups in terms of columns, wherein 1<m≤N, N is the total number of columns. Beginning with the 1$^{st}$ group of pixel unit that is closest to the gate driver side of array substrate, the second tab 232 of active layer 230 of TFT in the j+1$^{th}$ group of pixel units has a width in the direction of gate line 210 smaller than that of the second tab 232 of active layer 230 of TFT in the j$^{th}$ group of pixel units in the direction of gate line 210 by $\Delta W2_j$, where 1≤j≤m−1. The second tabs 232 of active layer 230 of TFT in the same group have the same width in the direction of gate line. In one example, each group of pixel units has the same number of columns. In another example, m=n, especially in case that m=n and i=j, $\Delta W1_i = \Delta W2_j$.

Embodiments of the present invention further comprise a display device comprising the array substrate described in any of the above embodiments.

What is described above is related to the illustrative embodiments of the disclosure only and not limitative to the scope of the disclosure; the scopes of the disclosure are defined by the accompanying claims.

The present application claims the priority of Chinese patent application No. 201410235356.3 filed on May 29, 2014, the disclosure of which are incorporated herein in its entirety by reference.

The invention claimed is:

1. An array substrate, comprising gate lines, data lines, and a plurality of pixel units defined by intersecting the gate lines and the data lines, the gate lines, the data lines and the pixel units being formed on a substrate, wherein each pixel unit comprises a thin film transistor (TFT), in an overlapping area between an active layer and a source of the TFT, the active layer comprises at least two first tabs protruding beyond a gate of the TFT, the at least two first tabs are disposed on both sides of a central line of the active layer parallel to the gate line respectively and have a same width in a direction of gate line; the at least two first tabs are arranged in symmetry; the farther from a gate driver side of the array substrate is, the width of the first tabs in the direction of gate line has an increasing tendency.

2. The array substrate of claim 1, wherein in an overlapping area between an active layer and a drain of the TFT, the active layer further comprises at least two second tabs protruding beyond a gate of the TFT, the at least two second tabs are disposed on both sides of the central line of the active layer parallel to the gate line respectively and have a same width in the direction of gate line.

3. The array substrate of claim 2, wherein the at least two second tabs are arranged in symmetry.

4. The array substrate of claim 2, wherein the gate driver is disposed outside the array substrate.

5. The array substrate of claim 1, wherein the pixel units are divided into n groups in terms of columns, wherein 1<n≤N, N is a total number of columns; beginning with a first column of pixel units closest to the gate driver of array substrate, the first tab of active layer of TFT in the i+1$^{th}$ group of pixel units has a width in the direction of gate line greater than that of the first tab of active layer of TFT in the i$^{th}$ group of pixel units by $\Delta W1_i$, wherein $1 \le i \le n-1$; the first tabs of active layer of TFT in a same group have a same width in the direction of gate line.

6. The array substrate of claim 5, wherein each group of pixel units has a same number of columns.

7. The array substrate of claim 6, wherein the farther from the gate driver side of the array substrate is, the width of the second tab of the active layer of the TFT in the direction of gate line has an decreasing tendency.

8. The array substrate of claim 7, wherein the pixel units are divided into m groups in terms of columns, wherein $1 < m \le N$, N is a total number of columns; beginning with a first column of pixel units closest to the gate driver of the array substrate, the second tab of active layer of TFT in the $j+1^{th}$ group of pixel units has a width in the direction of gate line smaller than that of the second tab of active layer of TFT in the $j^{th}$ group of pixel units in the direction of gate line by $\Delta W2_j$, where $1 \le j \le m-1$; the second tabs of active layer of TFT in a same group of pixel units have a same width in the direction of gate line.

9. The array substrate of claim 8, wherein each group of pixel units has a same number of columns.

10. The array substrate of claim 8, wherein m=n.

11. The array substrate of claim 10, wherein in condition that i=j, $\Delta W1_i = \Delta W2_j$.

12. The array substrate of claim 1, wherein a material for the active layer is oxide semiconductor.

13. A display device, comprising the array substrate of claim 1.

* * * * *